(12) United States Patent
Okano et al.

(10) Patent No.: US 7,063,543 B2
(45) Date of Patent: Jun. 20, 2006

(54) ASSEMBLY FOR CONNECTING A BUSBAR AND PRINTED CIRCUIT BOARD

(75) Inventors: Hirofumi Okano, Kawagoe (JP); Hiroshi Ochiai, Kawagoe (JP)

(73) Assignee: Kabushiki Kaisha T AN T, Kawagoe (JP)

( * ) Notice: Subject to any disclaimer, the term of this patent is extended or adjusted under 35 U.S.C. 154(b) by 0 days.

(21) Appl. No.: 11/005,309

(22) Filed: Dec. 7, 2004

(65) Prior Publication Data

US 2005/0136718 A1 Jun. 23, 2005

(30) Foreign Application Priority Data

Dec. 22, 2003 (JP) .............................. 2003-425313

(51) Int. Cl.
*H01R 12/00* (2006.01)
(52) U.S. Cl. ..................................... 439/76.2
(58) Field of Classification Search .............. 439/76.2, 439/949, 404
See application file for complete search history.

(56) References Cited

U.S. PATENT DOCUMENTS 5,734,125 A * 3/1998 Yasukuni et al. .......... 174/52.2
6,273,593 B1 8/2001 Yabata et al.
6,322,376 B1 * 11/2001 Jetton ........................ 439/76.2
6,325,642 B1 * 12/2001 Asao ......................... 439/76.2
6,402,570 B1 6/2002 Soga et al.
6,894,891 B1 * 5/2005 Darr et al. .................. 361/601

FOREIGN PATENT DOCUMENTS

| JP | 63-45923 | 3/1998 |
| JP | 2000-344010 | 12/2000 |
| JP | 2001-180372 | 3/2001 |

\* cited by examiner

*Primary Examiner*—Tulsidas C. Patel
*Assistant Examiner*—Phuongchi Nguyen
(74) *Attorney, Agent, or Firm*—Nixon & Vanderhye P.C.

(57) ABSTRACT

A connecting structure for connecting a busbar base with a printed circuit board, in which the busbar base (11a or 13a) and a busbar (5) fixed to the busbar base (11a or 13a) form an electrical circuit, includes a male terminal (5a) protruding from the busbar (5), and a female terminal (4b) connected to a conductive pattern of the printed circuit board (4). The connecting structure is characterized in that the busbar (5) fixed to the busbar base (11a or 13a) and the conductive pattern of the printed circuit board (4) are electrically and securely connected when the male terminal (5a) is fitted into the female terminal (4b).

5 Claims, 3 Drawing Sheets

ASSEMBLY FOR CONNECTING A BUSBAR AND PRINTED CIRCUIT BOARD

BACKGROUND OF THE INVENTION

1. Field of the Invention

The present invention relates to a connecting structure to connect various components of a vehicular interior light unit, for example, a lamp accommodated in the light unit's housing, a switch that controls the lamp's illumination, the busbar base for connecting the lamp with the switch, and a conductive pattern of a printed circuit board (PCB), the PCB including a light-emitting diode (LED) attached thereto for partially illuminating the position of an interior component of the vehicle (e.g., a cup holder or the like).

2. Description of the Related Art

A known vehicular interior light unit disclosed in, for example, U.S. Pat. No. 6,402,570 (the entire content of which is expressly incorporated hereinto by reference), includes a busbar attached to the back side of a base that is formed by injection molding, for connecting a power source, a switch, and a lamp that is accommodated in the base. When the switch is turned on, the busbar connects the lamp with the power source to turn the lamp on.

Since the above-described vehicular interior light unit only controls the switching of the lamp, the network is sufficiently simple to be formed by a single busbar. However, a light unit which further includes a light-emitting diode (LED) for partially illuminating the position of a cup holder or the like has been developed in recent years.

In such a light unit, a printed circuit board (PCB) is accommodated in a housing, and the LED is attached thereto. The conductive pattern of the PCB is connected to the busbar by connecting male connectors formed on the busbar with female connectors having leads extending therefrom, and then connecting the leads with the conductive pattern of the PCB. Alternatively, the conductive pattern of the PCB is connected to the busbar by connecting the male connectors formed on the busbar with male connectors formed on the PCB using female connectors having leads therebetween. In this manner, the whole network is formed.

According to the network formed by electrically connecting the busbar with the PCB using such connectors, a number of parts are required, and many hours are required for soldering the leads to the PCB or for connecting the connectors, therefore increasing the costs.

SUMMARY OF THE INVENTION

Accordingly, it is an object of the present invention to provide a connecting structure for electrically connecting a busbar of a busbar base with a conductive pattern of a printed circuit board (PCB) by fitting a male terminal formed on one of the busbar base and the PCB into a female terminal formed on the other so as to improve the work efficiency of circuit connection.

According to one aspect of the present invention, means are provided for connecting a busbar base with a PCB in which the busbar base and a busbar fixed to the busbar base form an electrical circuit. Such busbar connecting means preferably includes a male terminal protruding from the busbar, and a female terminal connected to a conductive pattern of the PCB. The means is especially characterized in that the busbar fixed to the busbar base and the conductive pattern of the PCB are electrically and securely connected when the male terminal is fitted into the female terminal.

Alternatively, the male terminal may be connected to a conductive pattern of the PCB, while the female terminal is formed as a component part of the busbar.

As described above, the present invention can improve the work efficiency of the circuit connection simply by fitting the male terminal into the female terminal to electrically connect the busbar fixed to the busbar base with the conductive pattern of the PCB.

According to another aspect of the present invention, the busbar connecting means may be provided with a flat male terminal such that the female terminal is capable of elastically pinching the male terminal from both sides thereof. Accordingly, the busbar base and the PCB are easily connected but not easily disconnected by disturbances such as vibrations.

According to yet another aspect of the present invention, the PCB may be fitted into a compartment of a housing so as to not rattle in the horizontal plane of the printed circuit board. An inset connection between the male terminal and the female terminal may also be provided so as to prevent the PCB from moving vertically when the busbar base is fixed to the housing. Accordingly, the PCB is reliably fixed in the housing regardless of disturbances such as vibrations.

The present invention may also include a PCB that is securely fixed to the housing with a stopper disposed on the housing and a hole bored through the PCB. Accordingly, the PCB is further reliably fixed in the housing and is not susceptible to becoming dislodged therefrom regardless of disturbances it may encounter, such as vibrations.

BRIEF DESCRIPTION OF THE DRAWINGS

Reference will be made to the accompanying drawings wherein like reference numerals throughout the various Figures denote like structural elements, and wherein.

DESCRIPTION OF THE PREFERRED EMBODIMENTS

According to the connection between a busbar base and a printed circuit board (PCB) of the present invention, one of the busbar base and the PCB has a male terminal, and the other has a female terminal. The male terminal is fitted into the female terminal to electrically connect a busbar fixed to the busbar base with a conductive pattern of the PCB.

An embodiment of the connecting structure between the busbar base and the PCB according to the present invention applied to a vehicular interior light unit will now be described with reference to the drawings.

Figure 1:
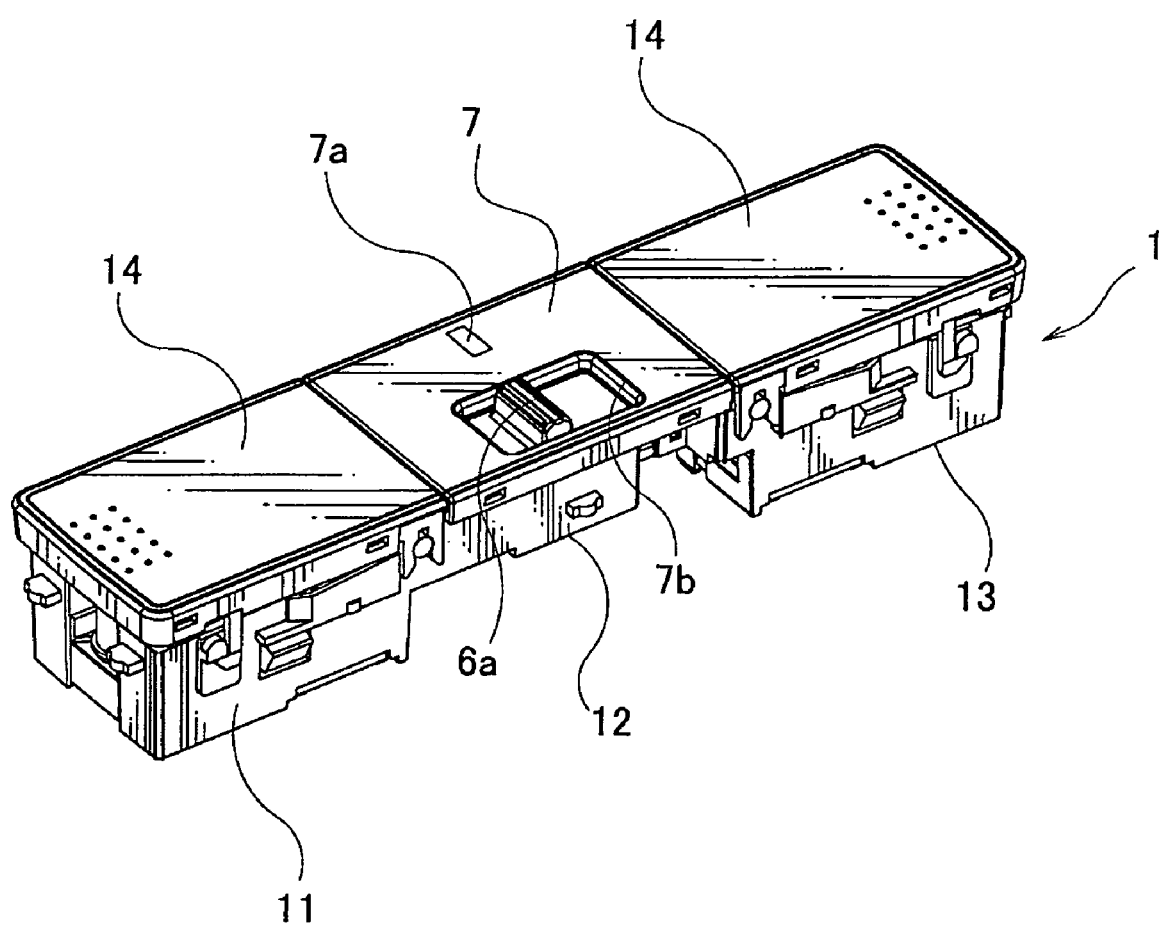
FIG. 1 is a perspective view, shown from the top, of a connecting structure between the busbar base and the PCB according to an embodiment of the present invention applied to an interior light unit.

A housing 1 is a box formed by injection molding and the like, and is partitioned transverse to its longitudinal extent into three sections 11, 12 and 13. The lateral sections 11 and 13 disposed at both ends have busbar bases 11a and 13a, respectively, formed at the bottom sides thereof for wiring busbars 5 (see FIGS. 2 and 3). Each of the busbar bases 11a, 13a accommodate a lamp holder 2 for fixing a lamp (not shown), and a push switch 3. The busbars 5 for connecting the lamp holders 2, the push switches 3, and a PCB 4 (described below) are attached to the busbar bases 11a and 13a. A pair of lens plates 14 (see FIG. 1) is cantilevered on the top side of the housing 1 adjacent to the center so as to be rockable.

When the lens plate 14 is pushed at a position remote from the support, the push switch 3 is turned on to switch the lamp on. When the lens plate 14 is pushed again, the push switch 3 is turned off to switch the lamp off. A vehicular interior light unit having such a structure is well known, and is disclosed in, for example, U.S. Pat. No. 6,273,593 (the entire content of which is expressly incorporated hereinto by reference).

Figure 2:
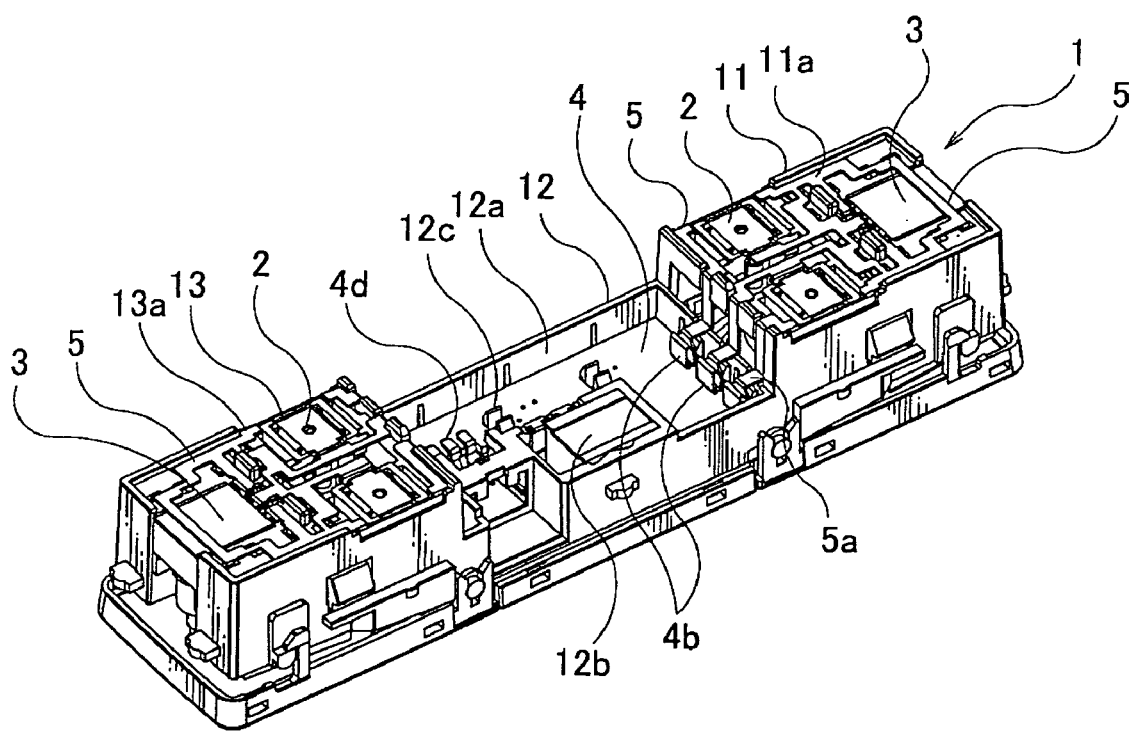
FIG. 2 is a perspective view of the above-described connecting structure shown from the bottom.
Figure 3:
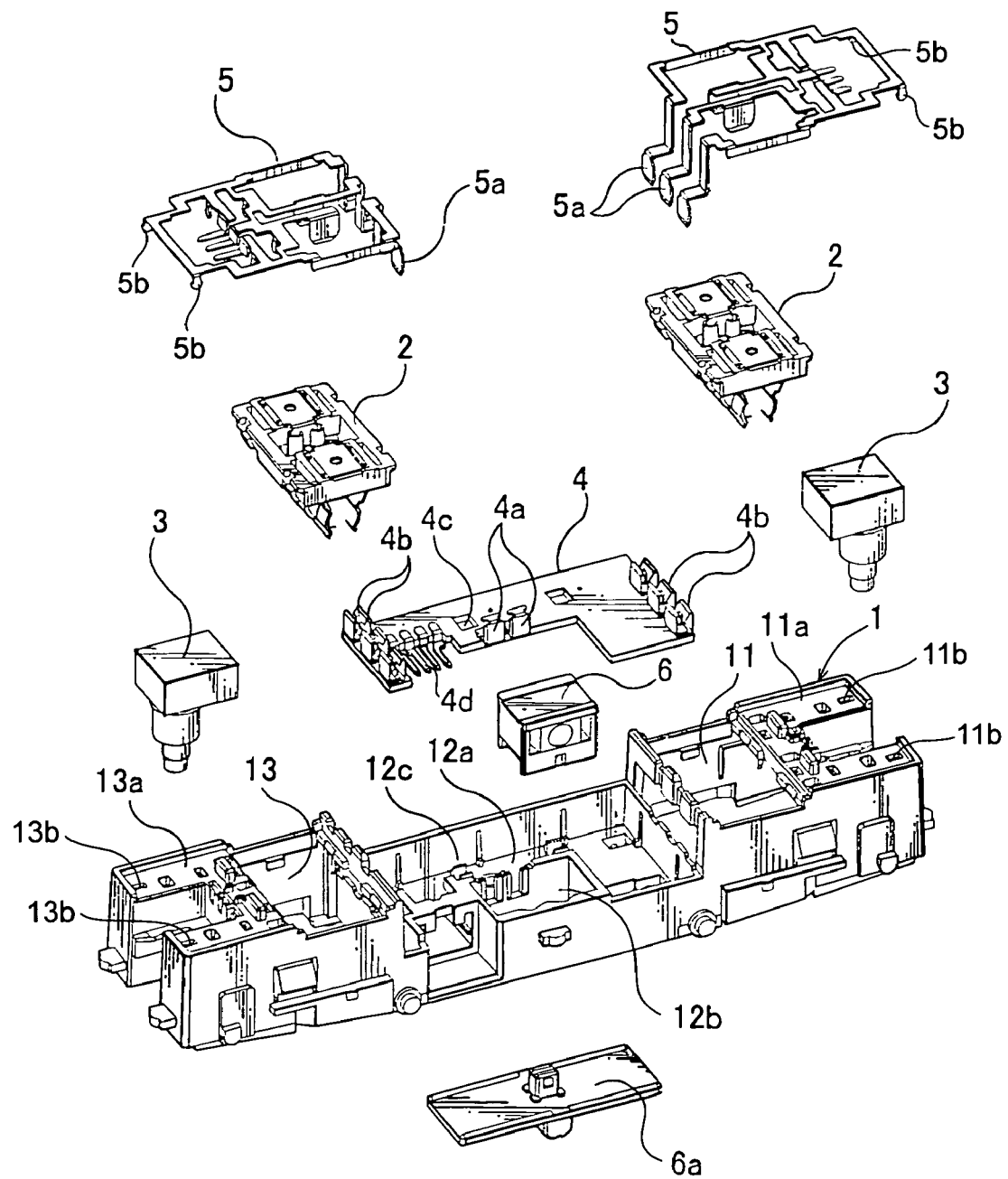
FIG. 3 is an exploded perspective view of the above-described connecting structure.

Furthermore, as shown in FIGS. 2 and 3, the section 12 at the center of the housing 1 has a compartment 12a accommodating the PCB 4 and a compartment 12b accommodating a sliding member 6 for a sliding switch.

The PCB 4 fits into the compartment 12a so as not to rattle in the horizontal direction. A light-emitting diode (LED; not shown), electronic parts for driving the LED, and the base portions of fixed contact members 4a to be fitted into slits in the wall of the compartment 12b are soldered to the PCB 4.

Furthermore, female terminals 4b for elastically pinching flat male terminals 5a extending downward from the busbars 5 are soldered to both ends (the left side and the right side in the drawings) of the PCB 4 so as to protrude upward from the PCB. These female terminals 4b are bent to be heart-shaped when viewed from the side, and therefore frictionally pinch the male terminals 5a from both sides when the male terminals 5a are press-fitted into the female terminals 4b.

A plate 7 is fixed at the center of the top surface of the housing 1. The plate 7 has a hole 7a for passing light from the LED soldered to the PCB 4, and a slit 7b for a slider 6a that is connected to the sliding member 6. When the slider 6a is moved in the transverse direction, the sliding switch is turned on and off. When the switch is on, the LED is turned on, and the light passes through the hole 7a to partially illuminate a shift lever of the vehicle, a cup holder, or the like.

A pair of stoppers 12c protrudes from the center section 12 of the housing 1. The PCB 4 is fixed when the stoppers 12c are fitted into holes 4c bored through the PCB 4. In addition, a connector terminal 4d is soldered to the PCB 4, and is fitted into a connector (not shown) extending from a power source or a door switch that is turned on and off by the opening and the closing of a door. Thus, the PCB 4 and the busbars 5 are powered and receive switching signals from the door switch.

The sequence of assembly will now be described on the basis of the above-described structure. The PCB 4 having the above-described LED, electronic parts, female terminals 4b, and connector terminal 4d soldered thereto is disposed in the center compartment 12a, and the stoppers 12c are fitted into the holes 4c to fix the PCB 4. At the same time, the fixed contact members 4a soldered to the PCB 4 are fixed to the wall of the compartment 12b.

Fixing by means of the stoppers 12c and the holes 4c is not necessary. The PCB 4 can be fixed with respect to the vertical direction by fitting the male terminals 5a into female terminals 4b (described below).

Subsequently, the lamp holder 2 and the push switch 3 are fixed to the sections 11 and 13 of the housing 1 with fixing mans (not shown), and the busbars 5 are fixed to the busbar bases 11a and 13a of the housing 1 with appropriate means (for example, by fitting fixed connection pieces 5b into connection holes 11b and 13b, respectively, formed in the housing 1) while the busbars 5 are connected to the lamp holder 2 and the push switch 3. At the same time as this connection, the male terminals 5a formed on the busbars 5 are fitted into the female terminals 4b to electrically connect the busbars 5 with the conductive pattern of the PCB 4.

The sliding member 6 is then placed into the compartment 12b, and the slider 6a is connected to the sliding member 6. Finally, the plate 7 is fixed to the top surface of the housing 1.

As described above, the connection between the male terminals 5a and the female terminals 4b electrically connects the busbars 5 with the conductive pattern of the PCB 4. In addition, since the female terminals 4b pinch the male terminals 5a from both sides, excellent electrical connection is achieved to prevent failures caused by poor connection.

In the above-described embodiment, the male terminals 5a of the busbars 5 are flat, and the female terminals 4b on the PCB 4 pinch the male terminals 5a. Alternatively, the terminals of the busbars 5 may be of a female type, and the terminals on the PCB 4 may be of a male type. Furthermore, the shapes of the male terminals and the female terminals are not limited to the above-described embodiment, and various shapes, for example, a pillar-shaped male terminal and a tubular female terminal, may be adopted.

The present invention is applied to a vehicular interior light unit in the above-described embodiment; however, the present invention is applicable to any devices that connect a busbar base with a PCB.

What is claimed is:

1. An assembly comprising:
   a busbar base having a plurality of connection holes;
   a busbar having at fixed connection pieces protruding outwardly therefrom, each fixed connection piece being inserted into respective one of the connection holes of the busbar base so as to fix the busbar to the busbar base,
   a printed circuit board having a printed circuit pattern, and
   a connecting structure for connecting the busbar and the printed circuit pattern of the printed circuit board, wherein said connecting structure comprises male and female terminals, wherein
   (i) one of the male and female terminals protrudes outwardly from the busbar; and
   (ii) the other of the male and female terminals being soldered to the conductive pattern of the printed circuit board and protruding outwardly from the printed circuit board in opposition to the one of the male and female terminals protruding outwardly from the busbar, and wherein
   (iii) said male and female terminals being frictionally engaged with one another so as to establish electrical and structural connection between the conductive pattern of the printed circuit board and the busbar fixed to the busbar base by means of the fixed connection pieces inserted into the connection holes thereof and thereby prevent the printed circuit board from moving vertically relative to the busbar base.

2. The assembly of claim 1, wherein the male terminal is formed on the busbar, and wherein the female terminal is soldered to the conductive pattern of the printed circuit board.

3. The assembly of claim 1, wherein the male terminal is soldered to the conductive pattern of the printed circuit board, and wherein the female terminal is formed on the busbar.

4. The assembly of claim 2 or 3, further comprising:

a housing having a compartment, said printed circuit board being fitted securely into the compartment of the housing so as not to rattle in a horizontally planar direction of the printed circuit board, wherein the busbar base is fixed to the housing, and wherein the connection between the male and female terminals prevents the printed circuit board from moving vertically.

5. The assembly of claim 4, further comprising a stopper disposed on the housing, and a hole formed through the printed circuit board, wherein said stopper is inserted into said hole for securely mounting the printed circuit board to the housing.

* * * * *